United States Patent [19]
Hara et al.

[11] Patent Number: 5,289,405
[45] Date of Patent: Feb. 22, 1994

[54] SEMICONDUCTOR MEMORY CIRCUIT DEVICE HAVING MEMORY CELLS CONSTRUCTED ON A BICMOS GATE ARRAY

[75] Inventors: Hiroyuki Hara, Fujisawa; Yoshinori Watanabe, Yokohama, both of Japan

[73] Assignee: Kabushiki Kaisha Toshiba, Kawasaki, Japan

[21] Appl. No.: 661,020

[22] Filed: Feb. 26, 1991

[30] Foreign Application Priority Data

Feb. 28, 1990 [JP] Japan .................................. 2-45518

[51] Int. Cl.[5] .............................................. G11C 7/00
[52] U.S. Cl. .............................. 365/189.08; 365/225.6
[58] Field of Search ...................... 365/189.01, 189.08, 365/189.09, 190, 225.6

[56] References Cited

U.S. PATENT DOCUMENTS 4,995,001 2/1991 Dawson et al. ................. 365/190 X

FOREIGN PATENT DOCUMENTS 0280257 8/1988 European Pat. Off. .

OTHER PUBLICATIONS

M. Kawauchi et al., "A 1.0um Compilable FIFO Buffer for Standard Cell," IEEE 1989 Custom Integ. Circuits Conf., May 15-18, 1989, pp. 23.4.1-23.4.4.
A 4-ns 4Kx1-bit Two-Port BiCMOS SRAM. IEEE Journal of Solid-State Circuits, vol. 23, No. 5, Oct. 1988 by T. S. Yang, et al.

*Primary Examiner*—Steven Mottola
*Attorney, Agent, or Firm*—Finnegan, Henderson, Farabow, Garrett & Dunner

[57] ABSTRACT

A semiconductor memory circuit device having memory cells constructed on a BiCMOS gate array includes amplifying means constituted by a bipolar transistor connected to the output stage of each of memory cells arranged in a matrix form on a semiconductor substrate and formed in a gate array memory cell configuration by use of the Master slice approach. The amplifying means amplifies the potential level of readout data of the memory cell and output the same to an output line, thus enhancing the driving ability of the output line and reducing the whole readout time for reading out data from the memory circuit.

8 Claims, 2 Drawing Sheets

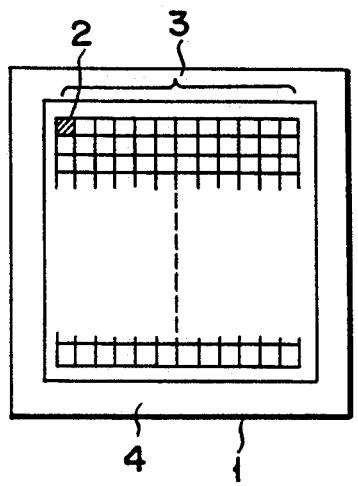
F I G. 1
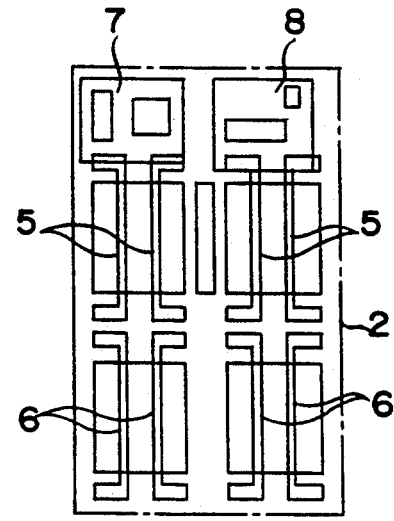
F I G. 2
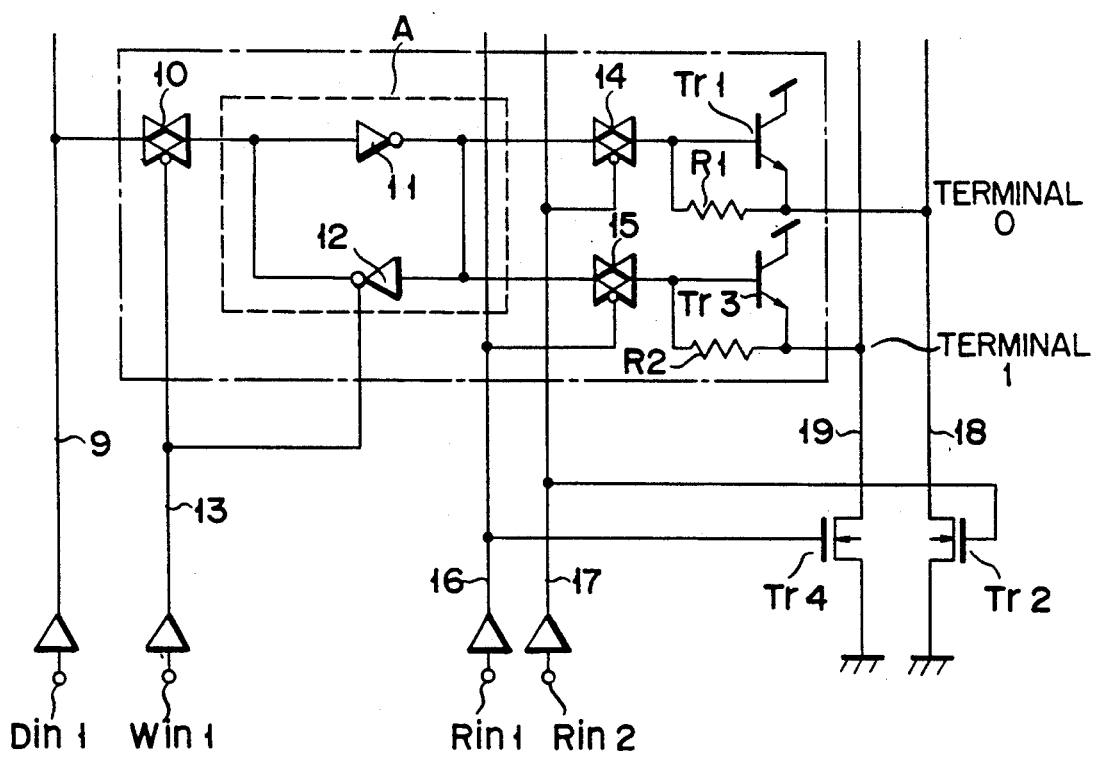
F I G. 3

SEMICONDUCTOR MEMORY CIRCUIT DEVICE HAVING MEMORY CELLS CONSTRUCTED ON A BICMOS GATE ARRAY

BACKGROUND OF THE INVENTION

1. Field of the Invention

This invention relates to a semiconductor memory circuit device such as a random access memory (RAM) constituted by basic cells formed on a semiconductor substrate according to the Master slice approach, and more particularly to a semiconductor memory circuit device in which time for data readout is reduced.

2. Description of the Related Art

In general, the master slice approach is known as a technique of forming an integrated circuit on a semiconductor substrate.

With the Master slice approach, basic cells corresponding to logic gates such as NAND gates or NOR gates are first formed on the semiconductor substrate in a matrix form, for example. After this, wirings are formed to interconnect the basic cells so as to form an integrated circuit according to the purpose of application thereof.

The integrated circuit formed by use of the Master slice approach includes a gate array type integrated circuit. The gate array type circuit may be used in CMOS gate arrays to constitute random access memories (which are hereinafter referred to as RAMs).

The RAMs constituted by use of CMOS arrays generally include write-in drivers, a plurality of memory sections constituting memory cells, readout inverters and the like, and the RAMs are connected to at least one input line and at least one output line.

That is, write-in data is written into at least one memory cell via the input line. The write-in data is read out from the memory cell in response to a readout signal and output via the output line. A value of a potential level corresponding to the data held in the memory section is output via the output line by means of the readout inverter as the readout data output from the output stage of the memory cell.

Thus, since the output line is driven according to the potential level of the readout data output from the output stage of each memory cell, the whole readout time of the RAMs is determined by the driving ability of the output stage of each memory cell.

In general, in order to reduce the readout time, it may be effective to enhance the driving ability of the output stage by changing the dimensions of the element constituting the memory cell. However, as described before, since the gate array type memory cell is an integrated circuit which is formed by interconnecting previously formed circuit elements, it becomes impossible to form the individual RAMs by use of elements having proper dimensions so as to meet the purpose of application.

As a result, if a large number of memory cells are connected to one output of memory cell, the potential level of data output from the output stage of the RAM becomes low speed and is not high speed enough to drive the output line. Therefore, it is difficult to operate the memory cells at a high speed operation and reduce the readout time of the RAMs.

SUMMARY OF THE INVENTION

An object of this invention is to provide a semiconductor memory circuit device having gate array memory cells in which bipolar transistors are used in the output stages of memory cells to amplify readout data from the memory cells and output the readout data to an output line so as to enhance the driving ability and reduce time for reading out data from a memory circuit without increasing the dimensions of elements constituting the memory cells.

The above object can be attained by a semiconductor memory circuit device having gate array memory cells, comprising at least one memory cell which is formed by the Master slice approach and includes an input line to which write-in data is input, input switching means connected to the input line and operated by a write-in signal, a data holding section connected to the input switching means, for holding write-in data, output switching means connected to the data holding section and operated by a readout signal, and amplifying means connected to a succeeding stage of the output switching means to amplify data read out from the data holding section; an output line connected to the amplifying means of the memory cell; and switching means having a control gate which is connected at one end to the output line and grounded at the other end and operated by the readout signal to set a reference low level of the readout data; wherein the potential level of the readout data of the memory cell is amplified and output to the output line so as to enhance the driving ability of the output line and reduce the whole readout time for reading out data from a memory circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a plan view of a gate array according to a first embodiment of this invention;

FIG. 2 is a view showing the construction of a basic cell which is a basic element of the gate array;

FIG. 3 is a circuit diagram showing the circuit construction of a RAM formed above the gate array shown in FIG. 1;

DETAILED DESCRIPTION OF THE PREFERRED EMBODIMENTS

Figure 4:
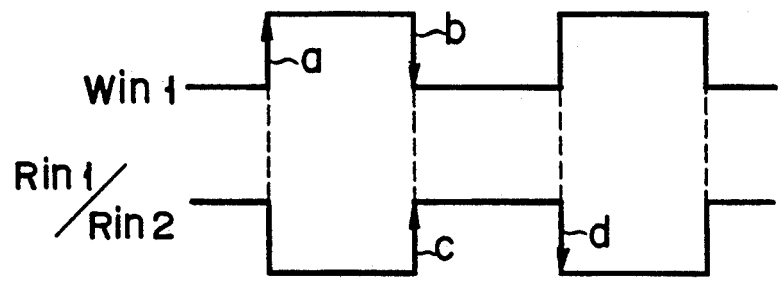
FIG. 4 is a timing chart showing the operation of the RAM shown in FIG. 1.

There will now be described an embodiment of this invention with reference to the accompanying drawings.

FIG. 1 is a plan view of a gate array for realizing this invention, FIG. 2 is a view showing the construction of a basic cell and FIG. 3 is a circuit diagram showing the circuit construction of a 3-port RAM having one write-in line and two readout lines.

That is, FIG. 1 shows a BiMOS gate array 1 formed to have the construction as will be described later on the semiconductor substrate. The BiMOS gate array 1 includes a plurality of basic cell columns 3 of basic cells 2 and a peripheral section 4 which is provided around the basic cell columns and in which connection pads for connection with input/output circuits and other circuits are formed.

FIG. 2 is a diagram showing the construction of one of the basic cells 2 in the BiMOS gate array 1. The basic cell 2 includes P-channel MOS transistors 5, N-channel MOS transistors 6, bipolar transistor 7 and resistor 8.

The circuit diagram of FIG. 3 shows the circuit construction of a 3-port RAM (input 1, output 2) occupied by two basic cells 2.

An input line 9 for receiving write-in data input from a data input terminal Din 1 is connected to the input terminal of a transfer gate 10 used as a switch. The transfer gate 10 is connected to the input terminal of an inverter 11 constituting a holding section A for holding write-in data input from the data input terminal Dinl.

The holding section A is constructed by the inverter 11 and a clocked inverter 12 which are connected to constitute a cross coupled inverter.

Further, the control terminal of the transfer gate 10 and the output terminal of the clocked inverter 12 are connected to a write-in signal input terminal Winl to which a write-in signal for changing the switching position of the switch via a write-in signal line 13.

The output terminal of the inverter 11 serving as the output terminal of the holding section A is connected to the input terminals of transfer gates 14 and 15.

The gate control terminal of the transfer gate 14 is connected to a readout signal input terminal Rinl to which a readout signal for changing the switching position of the switch is input via a readout signal line 16 for receiving the readout signal, and the transfer gate 14 is used as the switch. Likewise, the control terminal of the transfer gate 15 is connected to a readout signal line 17 to which a readout signal from a readout signal input terminal Rin2 is input and the transfer gate 15 is used as a switch.

Further, the output terminal of the transfer gate 14 is connected to the base of a bipolar transistor Trl and one end of a resistor R1. The collector of the bipolar transistor Trl is connected to a power source and the emitter thereof is connected to the other end of the resistor R1 and an output line 18 of port 0 of the RAM.

The output line 18 is connected to the drain of an N-channel MOS transistor Tr2. The source of the N-channel MOS transistor Tr2 is grounded and the gate thereof is connected to the readout signal line 17. Further, the output terminal of the transfer gate 15 is connected to the base of a bipolar transistor Tr3 and one end of a resistor R2.

The collector of the bipolar transistor Tr3 is connected to the power source and the emitter thereof is connected to the other end of the resistor R2 and an output line 19 of port 1 of the RAM. The output line 19 is connected to the drain of an N-channel MOS transistor Tr4. The source of the N-channel MOS transistor Tr4 is grounded and the gate thereof is connected to the readout signal line 16.

Next, the operation of the RAM constructed on an BiMOS gate array is explained with reference to FIG. 3 and the timing chart of FIG. 4.

First, the write-in operation is explained. A transfer gate 10 acting as an input switch is opened in the data write-in mode by the rise ("a") of a write-in signal from the write-in signal line 13 to a high (H) level so as to permit data to be written into an inverter 11 from an input line 9. At this time, a clocked inverter 12 is set in the input disable condition so as to prevent to-be-written data from being superposed on the data which has been held When the write-in signal falls ("b") to a low (L) level after a preset period of time has elapsed, the transfer gate 10 is closed and the clocked inverter 12 for holding data is set into the write-in enable condition, thereby permitting data written by the inverter 11 to be received with an inverted phase.

Next, the data readout operation is explained.

First, when the readout signal of the readout signal line 17 has risen ("c") to the "H" level in the data holding condition before the readout operation is effected, a voltage applied to the output line 18 is lowered to a reference low level (Lo) because of the ON-state of the N-channel MOS transistor Tr2 (in this case, the reference low level "Lo" is substantially equal to the "L" level of the readout data to be output).

At the time of the above voltage drop, the base potential of the bipolar transistor Trl is lowered to the "L" level by means of the resistor R1. As a result, the bipolar transistor Trl is turned off.

Next, when the readout signal has fallen to the "L" level ("d"), the N-channel MOS transistor Tr2 is turned off and the transfer gate 14 is opened. As a result, data held by the holding section A is supplied to the bipolar transistor Trl so as to turn on the same.

Thus, the bipolar transistor Trl amplifies data held and outputs the amplified data to the output line 18.

Also, the readout operation of reading out data from the transfer gate 15 is effected by amplifying data held by the bipolar transistor Tr3 in the same manner as in the readout operation of reading out data from the transfer gate 14 and outputting the output data to the output line 19. That is, in this embodiment, data can be read out via the readout lines from the transfer gates 15 and 14 in parallel.

In a case where data from the memory cell is output at the "H" level, the bipolar transistor Trl is turned on, a potential applied to the output line 18 is changed from "Lo" to "H" and then the readout operation is effected.

Further, in a case where data from the memory cell is output at the "L" level, the bipolar transistor Trl is turned off before the readout operation is effected. Data of "L" level is output from the inverter 11 and 12 of the memory cell via the transfer gate 14 and resistor R1. In practice, however, since the potential level of the output line 18 is set to the "Lo" level before the readout operation, the readout time of the output data can be substantially neglected.

Figure 5:
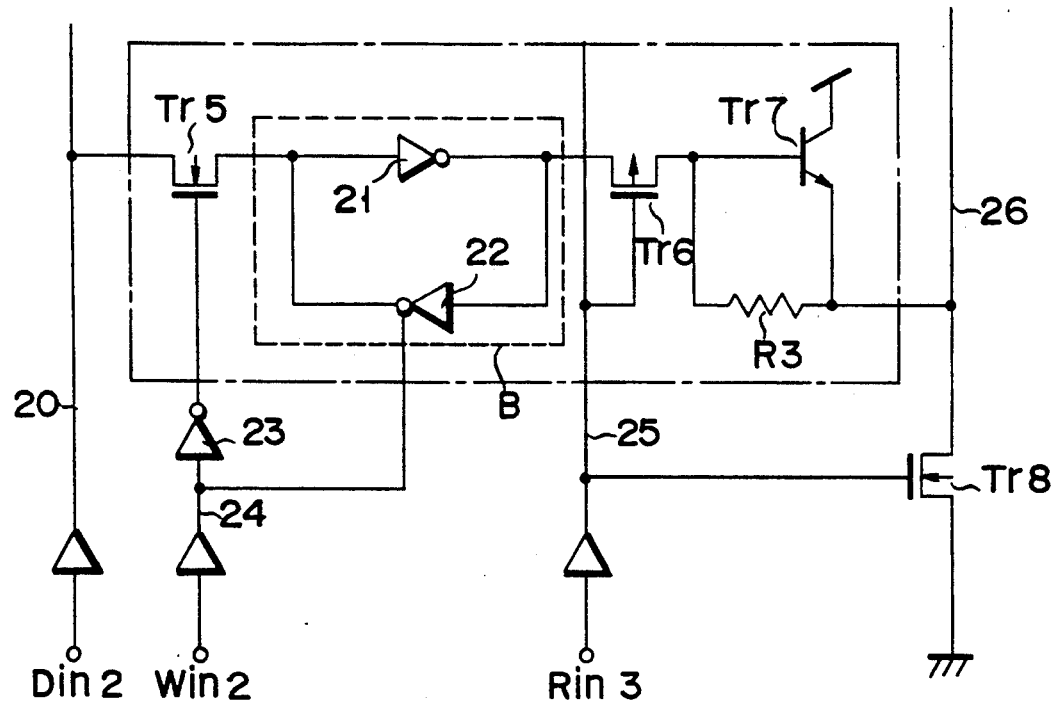
FIG. 5 is a circuit diagram showing the circuit construction of a RAM according to a second embodiment.

FIG. 5 is a circuit diagram showing a 2-port RAM having one write-in line and one readout line formed on the semiconductor substrate according to a second embodiment of this invention.

That is, the circuit construction of the second embodiment is the same as that of the first embodiment, but the transfer gate is formed with a single channel so that it can be formed with one basic cell.

In this circuit, an input line 20 for receiving write-in data from a write-in data input terminal Din2 is connected to the source of an N-channel MOS transistor Tr5 (which is hereinafter referred to as a MOS transistor Tr5) functioning as a transfer gate. The drain of the MOS transistor Tr5 is connected to the input terminal of an inverter 21 of a data holding section B. The holding section B is constituted by the inverter 21 and a clocked inverter 22 which are connected to constitute to cross couple inverter. The gate of the MOS transistor Tr5 is connected to a write-in signal line 24 connected to a write-in signal input terminal Win2 via the inverter 21 and the clocked inverter 22 is also connected to the write-in signal line 24.

The output terminal of the holding section B is connected to the drain of a P-channel MOS transistor Tr6 (which is hereinafter referred to as a MOS transistor Tr6). The gate of the MOS transistor Tr6 is connected to a readout signal line 25 connected to a readout signal input terminal Rin3 and the source thereof is connected to the base of a bipolar transistor Tr7 and one end of a resistor R3.

The collector of the bipolar transistor Tr7 is connected to a power source and the emitter thereof is connected to the other end of the resistor R3 and an output line 26 of the RAM. The output line 26 is connected to the drain of an N-channel MOS transistor Tr8. The source of the N-channel MOS transistor Tr8 is grounded and the gate thereof is connected to the readout signal line 25.

Now, the data write-in and readout operations of the basic cell having the above circuit construction are explained.

First, the write-in operation will be explained. The MOS transistor Tr5 is turned on in response to a write-in signal on signal line 24, and clocked inverter 22 is set into a write inhibit state in response to the write-in signal. Inverter 21 receives data from input line 20 through MOS transistor Tr5. In the absence of the write-in signal, MOS transistor Tr5 is turned off and clocked inverter 22 is set into a write enable state. The circuit configuration of inverters 21 and 22 allows a substantially full amplitude data signal to be held in the holding section B, even though the single channel MOS transistor Tr5 cannot transmit a full amplitude signal to holding section B.

Next, in a case where output data from the memory cell is output at the "H" level in the readout operation, the MOS transistor Tr6 is turned on and the MOS transistor Tr8 is turned off by an input readout signal. As a result, a voltage of 5V is applied to the base of the bipolar transistor Tr7 so as to turn on the same, thereby changing the potential of the output line 26 from "Lo" to "H".

Further, even if the P-channel MOS transistor Tr6 of the transfer gate on the output side is turned on in a case where the output data is output at the "L" level, the bipolar transistor Tr7 is turned off since the output of the inverter 21 is at the "L" level. Therefore, the "L" level output cannot be output to the output line 26.

However, the potential of the readout line 26 is set to the "Lo" level by turning on the MOS transistor Tr8 before the readout operation. Assuming that the "Lo" level is maintained, it can be regarded that "L" level data is output to the output line 26 from the memory cell. Therefore, "L" can be read out from the output line 26.

As described above, the second embodiment is different from the first embodiment in the transfer gate, but the write in and readout operations thereof are substantially the same as those of the first embodiment. Further, in the second embodiment, the memory cell (one bit) can be realized by use of one basic cell shown in FIG. 2 and therefore the area of the RAM can be effectively used in comparison with the first embodiment.

As a result, the readout time for reading out data from the RAM can be reduced by using a bipolar transistor which is excellent in the driving ability as amplifying means in the output stage of each memory cell of the RAM.

Further, it is possible to connect an output transfer gate to the output terminal of the amplifying means, but in this case, since the driving operation of the bipolar transistor of the amplifying means is limited by the tolerance of the output transfer gate, it is connected between the output terminal of the data holding section of each memory cell and the base of the bipolar transistor in this invention.

In the case of a RAM constituted by a CMOS element, since the driving ability of each memory cell is small, the number of memory cells which are the load of the output line cannot be set to a large value. In order to solve this problem, the memory cells are divided into a plurality of blocks and the output line is divided into a plurality of output line sections for the respective memory cell blocks, thus reducing the load of each output line. As a result, the construction of the RAM becomes complicated, and since a tri-state is used, the number of gates used for readout becomes large, thereby increasing the delay time of each memory cell and lowering the readout speed.

The driving ability of each memory cell can be enhanced by applying this invention to the RAM constituted by the CMOS element so that it becomes unnecessary to divide the output line and the RAM structure can be simplified and the readout operation speed can be easily enhanced without giving influence caused by use of the tri-state to the delay time.

In general, bipolar transistors are already arranged on the entire surface of the gate array and are not effectively used for the circuit function. The use less area which is not used can be removed by effectively using the bipolar transistors.

As described above, according to the semiconductor memory circuit device using the memory cells having the output signal amplifying means disposed in the output stage, time for reading out data stored in the semiconductor memory circuit device can be reduced by amplifying readout data of the memory cell and outputting the same to the output line to enhance the driving ability thereof without changing the size of an area occupied by the transistors in the memory cells of the semiconductor memory circuit device.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor memory circuit device having memory cells constructed on a BiCMOS gate array, comprising:

basic cells in a matrix on a substrate in a gate array memory cell configuration by the Master slice approach and including:
an input line adapted to receive write-in data;
input switching means having a first end coupled to said input line, and a second end;

a write-in signal line adapted to receive a write-in signal used as a switching control signal for controlling said input switching means;

a data holding section having an end coupled to the second end of said input switching means, and an output, for holding the write-in data from said input line via said input switching means;

output switching means including a current path having a first end coupled to the output of said data holding section, and a second end;

a readout signal line adapted to receive at least one readout signal used as a switching control signal for controlling said output switching means;

amplifying means having an input coupled to the second end of said output switching means, and an output; and an output line coupled to the output of said amplifying means, for outputting readout data amplified by said amplifying means.

2. A semiconductor memory circuit device having the memory cells constructed on a BiCMOS gate array according to claim 1, wherein said amplifying means includes a bipolar transistor, the current path of said bipolar transistor is coupled at one end to said output line and coupled at the other end to a reference potential and said bipolar transistor is operated in response to the readout signal and which further comprises switching means for setting the reference low level of the readout data.

3. A semiconductor memory circuit device having the memory cells constructed on a BiCMOS gate array according to claim 1, further comprising an output transfer gate coupled between the output terminal of said data holding section of each of said memory cells and the base of said bipolar transistor.

4. A semiconductor memory circuit device having the memory cells constructed on a BiCMOS gate array according to claim 1, wherein bipolar transistors already arranged in said gate array are used.

5. A semiconductor memory circuit device having the memory cells constructed on a BiCMOS gate array according to claim 1, wherein said input switching means includes an N-channel MOS transistor, said output switching means includes a P-channel MOS transistor and said amplifying means coupled between said output terminal and said output switching means to amplify the readout data includes a bipolar transistor.

6. An apparatus, comprising:
a plurality of memory cells in an array configuration, each memory cell including a respective
input switching means including a control input, and a current path having a first end, and a second end,
a data holding section having an input coupled to the second end of said input switching means, and an output,
an output switching means including a control input, and a current path having a first end coupled to the output of said data holding section, and a second end, and
an amplifying means having an input terminal coupled to the second end of said current path included in said output switching means.

7. A semiconductor memory circuit device according to claim 6, wherein said amplifying means includes a bipolar transistor.

8. A semiconductor memory circuit device according to claim 6, wherein said output switching means includes an MOS transistor and said amplifying means includes a bipolar transistor.

* * * * *